United States Patent [19]

Kaifler

[11] Patent Number: 5,095,220
[45] Date of Patent: Mar. 10, 1992

[54] CIRCUIT CONFIGURATION FOR POTENTIAL TRIGGERING OF A FIELD EFFECT TRANSISTOR

[75] Inventor: Erich Kaifler, Taufkirchen, Fed. Rep. of Germany

[73] Assignee: Siemens Aktiengesellschaft, Munich, Fed. Rep. of Germany

[21] Appl. No.: 711,509

[22] Filed: Jun. 3, 1991

Related U.S. Application Data

[63] Continuation of Ser. No. 508,959, Apr. 12, 1990, abandoned.

[30] Foreign Application Priority Data

Apr. 14, 1989 [DE] Fed. Rep. of Germany ....... 3912347

[51] Int. Cl.$^5$ .............................................. G02B 27/00
[52] U.S. Cl. ...................................... 250/551; 307/311
[58] Field of Search ............... 250/551, 214 A, 214 R, 250/214 SW, 213 A; 307/311

[56] References Cited

U.S. PATENT DOCUMENTS 3,801,933 4/1974 Teare ............................. 250/214 A
4,568,834 2/1986 Sherman et al. .................... 250/551
4,647,794 3/1987 Guajardo ............................. 250/551

Primary Examiner—David C. Nelms
Assistant Examiner—K. Shami
Attorney, Agent, or Firm—Herbert L. Lerner; Laurence A. Greenberg

[57] ABSTRACT

A circuit configuration for potential-free triggering of an FET includes a source voltage terminal connected to the gate terminal of a depletion FET, and an optoelectronic coupler having a receiver circuit connected between the source terminal of the depletion FET and the source voltage terminal. A plurality of the circuit configuration may also be connected in series.

13 Claims, 1 Drawing Sheet

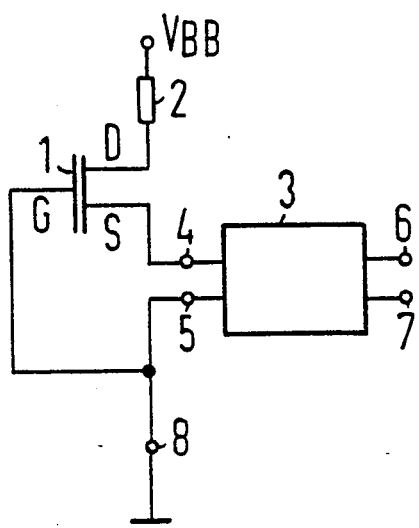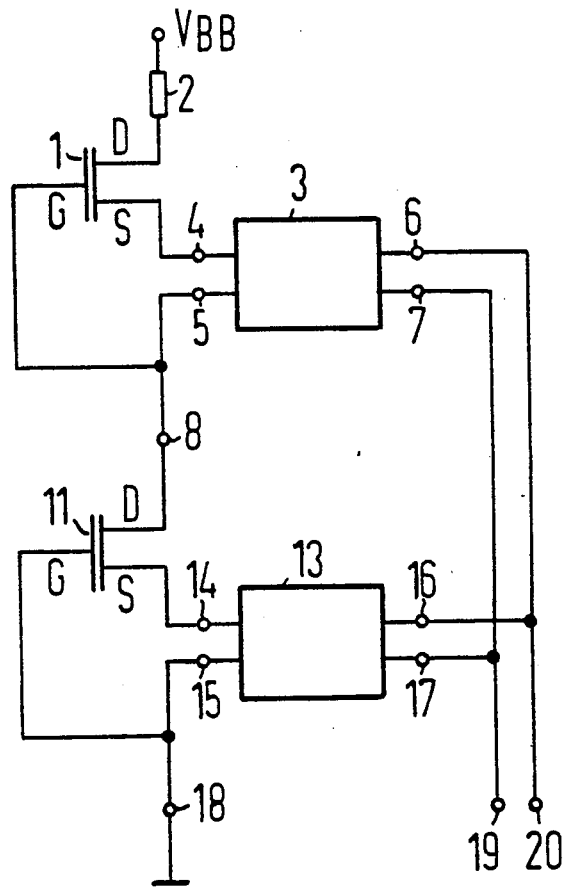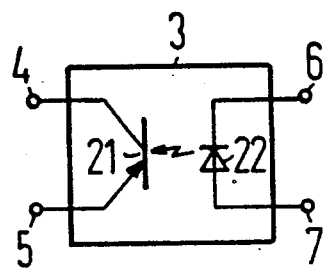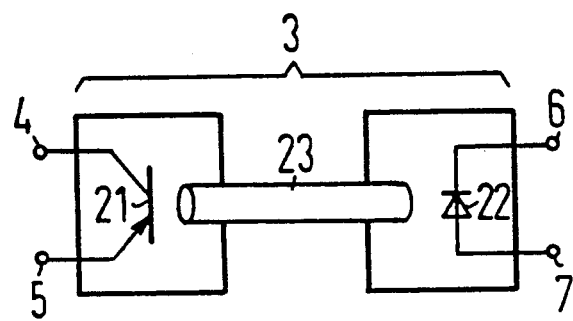

CIRCUIT CONFIGURATION FOR POTENTIAL TRIGGERING OF A FIELD EFFECT TRANSISTOR

This application is a continuation of application Ser. No. 508,959, filed Apr. 12, 1990, now abandoned.

The invention relates to a circuit configuration for potential-free triggering of a field effect transistor (FET). For many purposes it is desirable to trigger a field effect transistor without clamped potential. In other words, the source and drain connection terminals of the FET must be galvanically separated from the control circuit. This is important especially if the voltage to be switched is so high that a plurality of FETs must be connected in series. In that case, all of the FETs connected to various source potentials must be triggered with a single control voltage source. In the past, circuits which have attempted to accomplish such an objective have been quite complex.

It is accordingly an object of the invention to provide a circuit configuration for potential-free triggering of a field effect transistor, which is simple and overcomes the hereinafore-mentioned disadvantages of the heretofore-known devices of this general type.

With the foregoing and other objects in view there is provided, in accordance with the invention, a circuit configuration for potential-free triggering of an FET, comprising a source voltage terminal connected to the gate terminal of a depletion FET; and an optoelectronic coupler having a receiver circuit connected between the source terminal of the depletion FET and the source voltage terminal.

In accordance with another feature of the invention, there is provided a plurality of such circuit configuration being connected together in series.

In accordance with a further feature of the invention, the optoelectronic coupler or couplers include a phototransistor and at least one light-emitting diode.

In accordance with an added feature of the invention, the optoelectronic coupler or couplers include a phototransistor, a light source, and a fiber optic waveguide disposed between the phototransistor and the light source.

In accordance with a concomitant feature of the invention, the depletion FET is avalanche-proof.

Other features which are considered as characteristic for the invention are set forth in the appended claims.

Although the invention is illustrated and described herein as embodied in a circuit configuration for potential-free triggering of a field effect transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic circuit diagram of a first exemplary embodiment according to the invention;

FIG. 2 is a circuit diagram of a second exemplary embodiment of the circuit configuration;

FIG. 3 is a circuit diagram of a first embodiment of an optoelectronic coupler; and FIG. 4 is a circuit diagram of a second embodiment of an optoelectronic coupler.

Referring now to the figures of the drawing in detail and first, particularly, to FIG. 1 thereof, there is seen a circuit configuration which includes a depletion FET 1 having a drain terminal D that is connected through a load 2 to a supply voltage VBB. The source terminal S of the FET 1 is connected through the receiver circuit of an optoelectronic coupler 3 to a source voltage terminal 8. The receiver circuit of the optoelectronic coupler 3 is not shown for the sake of simplicity, but it is connected to output terminals 4, 5. The transmitter circuit of the optoelectronic coupler 3 is also not shown, but it is connected to input terminals 6, 7. The gate terminal G of the depletion FET 1 is connected to the source voltage terminal 8 and to the output terminal 5 of the optoelectronic coupler 3. The source voltage terminal 8 is connected to ground potential, for instance.

If there is no voltage applied to the input terminals 6, 7 of the optoelectronic coupler 3, then the receiver circuit has a high resistance between the output terminals 4, 5. If the voltage VBB is positive, then a depletion FET of the n-channel type is used. The source potential is therefore higher than the gate potential and the FET 1 is thus blocked.

If the optoelectronic coupler 3 is activated by applying a voltage to the input terminals 6, 7, then the receiver circuit between the output terminals 4, 5 has low impedance. The gate-to-source potential of the depletion FET is therefore approximately equal to zero, and the FET 1 is switched on.

The circuit configuration of FIG. 1 can advantageously be expanded to make a high-voltage switch, as schematically shown in FIG. 2. In this case, two of the configurations shown in FIG. 1 are connected in series. Connected to the source voltage terminal 8 is the drain terminal D of a second depletion FET 11. The source terminal S of the depletion FET 11 is connected through the receiver circuit of an optoelectronic coupler 13 to a source voltage terminal 18. The terminal 18 is, for instance, connected to ground potential. The receiver circuit of the optoelectronic coupler 13 is located between output terminals 14, 15. The optoelectronic coupler 13 has input terminals 16, 17, which are connected to the input terminals 6, 7 of the optoelectronic coupler 3 and to input terminals 19, 20 that are common to both optoelectronic couplers. If the transmitter circuits of the optoelectronic couplers 3, 13 are without voltage, the FETs 1 and 11 are blocked. If a control voltage is applied to the terminals 19, 20, both FETs are made conductive.

The circuit configuration of FIG. 2 can be expanded by adding series circuits of further circuit configurations according to FIG. 1, in order to accommodate higher voltages.

It is recommended that avalanche-proof depletion FETs be used for circuit configurations having more than one FET. This is recommended because the switching times of the FETs are never exactly the same. An avalanche-proof FET is capable of absorbing the full load current for a brief time, at full drain-to-source voltage. Assurance must be provided that it is made conductive no later than when this brief time elapses. The avalanche-proof FETs referred to herein are available on the market and are therefore not explained in further detail. The optoelectronic couplers 3, 13 may be conventionally formed of one phototransistor 21 and a light-emitting diode (LED) 22, as shown in FIG. 3. For alternating current applications, a photothyristor can be used instead of a phototransistor. The insulation path between the phototransistor 21 and the LED 2 must be dimensioned for the operating voltage VBB. If the insulation path of a conventional optoelectronic coupler is not sufficient for high operating voltages, then the version of an optoelectronic coupler shown in FIG. 4 can be used. In this case the phototransistor 21 is coupled to a light source, for instance the LED 22, through an optical fiber light guide or waveguide 23. The insulation path in that case is substantially determined by the length of the waveguide 23.

I claim:

1. Circuit configuration for potential-free triggering of an FET having a gate terminal and a source terminal, comprising:
    a) a source voltage terminal connected to the gate terminal of a depletion FET; and
    b) an optoelectronic coupler having a receiver circuit having two output terminals, one of said output terminals being connected to the source terminal of the depletion FET and the other of said output terminals being connected to said source voltage terminal and to said gate terminal.

2. Circuit configuration for potential-free triggering of an FET having a gate terminal and a source terminal, comprising a plurality of series-connected circuit portions, each of said circuit portions including:
    a) a source voltage terminal connected to the gate terminal of a depletion FET; and
    b) an optoelectronic coupler having a receiver circuit having two output terminals, one of said output terminals being connected to the source terminal of the depletion FET and the other of said output terminals being connected to said source voltage terminal and to said gate terminal.

3. Circuit configuration according to claim 1, wherein said optoelectronic coupler includes a phototransistor and at least one light-emitting diode.

4. Circuit configuration according to claim 2, wherein said optoelectronic coupler of each of said circuit portions includes a phototransistor and at least one light-emitting diode.

5. Circuit configuration according to claim 1, wherein said optoelectronic coupler includes a phototransistor, a light source, and a fiber optic waveguide disposed between said phototransistor and said light source.

6. Circuit configuration according to claim 2, wherein said optoelectronic coupler of each of said circuit portions includes a phototransistor, a light source, and a fiber optic waveguide disposed between said phototransistor and said light source.

7. Circuit configuration according to claim 1, wherein the depletion FET is avalanche-proof.

8. Circuit configuration according to claim 2, wherein the depletion FET is avalanche-proof.

9. Circuit configuration according to claim 3, wherein the depletion FET is avalanche-proof.

10. Circuit configuration according to claim 4, wherein the depletion FET is avalanche-proof.

11. Circuit configuration according to claim 5, wherein the depletion FET is avalanche-proof.

12. Circuit configuration according to claim 6, wherein the depletion FET is avalanche-proof.

13. Combination, comprising:
    a) a depletion FET having source, drain and gate terminals; and
    b) a circuit configuration for potential-free triggering of the FET including
        i) a source voltage terminal connected to the gate terminal of said FET; and
        ii) an optoelectronic coupler having a receiver circuit connected between the source terminal of said FET and said source voltage terminal.

* * * * *